(12) United States Patent
Yim et al.

(10) Patent No.: US 7,586,597 B2
(45) Date of Patent: Sep. 8, 2009

(54) DETECTION OF SEED LAYERS ON A SEMICONDUCTOR DEVICE

(75) Inventors: Ji Young Yim, Busan (KR); Jae Hong Kim, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 506 days.

(21) Appl. No.: 11/548,453

(22) Filed: Oct. 11, 2006

(65) Prior Publication Data

US 2007/0087530 A1    Apr. 19, 2007

(30) Foreign Application Priority Data

Oct. 11, 2005  (KR)  ...................... 10-2005-0095257

(51) Int. Cl.
    *G01N 21/00* (2006.01)
(52) U.S. Cl. .................. 356/237.2; 356/237.5
(58) Field of Classification Search .... 356/237.1–241.6
    See application file for complete search history.

(56) References Cited

U.S. PATENT DOCUMENTS

| | | | | |
|---|---|---|---|---|
| 4,887,904 A | * | 12/1989 | Nakazato et al. | ............ 356/621 |
| 6,132,587 A | * | 10/2000 | Jorne et al. | .................. 205/123 |
| 6,426,293 B1 | * | 7/2002 | Wang et al. | .................. 438/687 |
| 6,570,662 B1 | * | 5/2003 | Schietinger et al. | ......... 356/630 |
| 6,608,686 B1 | * | 8/2003 | Lane et al. | .................... 356/601 |
| 6,630,360 B2 | * | 10/2003 | Christian et al. | ............... 438/5 |
| 6,755,946 B1 | * | 6/2004 | Patton et al. | ............ 204/224 R |
| 2003/0168345 A1 | * | 9/2003 | Tsai et al. | .................... 205/157 |

* cited by examiner

*Primary Examiner*—Gregory J Toatley, Jr.
*Assistant Examiner*—Jarreas C Underwood
(74) *Attorney, Agent, or Firm*—Sherr & Vaughn, PLLC

(57) ABSTRACT

A device and/or method which detects a seed layer and a device and/or method of forming layers on a semiconductor device. The device which forms layers on the semiconductor device may include a metal layer forming unit (which forms a metal layer on a wafer), a copper seed layer forming unit (which forms a copper seed layer on the metal layer), a wafer alignment device (which includes a wafer alignment unit which aligns the wafer to a predetermined position), a copper seed layer detecting unit (which is positioned above the wafer alignment unit to detect the copper seed layer formed on the wafer), and a plating unit (which forms a copper interconnection layer on the copper seed layer).

8 Claims, 5 Drawing Sheets

DETECTION OF SEED LAYERS ON A SEMICONDUCTOR DEVICE

The present application claims priority under 35 U.S.C. 119 and 35 U.S.C. 365 to Korean Patent Application No. 10-2005-0095257 (filed on Oct. 11, 2005), which is hereby incorporated by reference in its entirety.

BACKGROUND OF THE INVENTION

1. Field of the Embodiments

Embodiments relate to a method and/or a device which detects a seed layer. Embodiments relate to a method and/or device which form layers on a semiconductor device. A device which detects a seed layer may use an inspection device, which may check whether the seed layer is formed on top of a wafer. Detection of a seed layer may occur prior to a plating process which forms an interconnection layer. In embodiments, a seed layer detecting device forms layers on a semiconductor device.

2. Description of Related Art

In general, line widths of interconnections and the intervals between interconnections of semiconductor devices have gotten smaller through the development of semiconductor technology. Some semiconductor devices have a multi-interconnection structure including interconnections and insulating layers, which may be alternately stacked. Semiconductor devices having multi-interconnection structures may include an upper interconnection connected to a lower interconnection through a via hole formed between insulating layers.

Semiconductor devices having multi-interconnection structures may have a relatively high degree of integration and/or may have a relatively simple circuit design. A semiconductor device having multi-interconnection structures may have reduced signal delay and/or improved operational speed. Semiconductor devices with micro-size line widths may have relatively high interconnection resistance. To reduce interconnection resistance, interconnections of semiconductor devices may be fabricated using a superior electric conductivity material.

Copper (Cu) (e.g. which has a lower electric resistance than aluminum (Al)) may be used as a material for interconnections in a semiconductor device. Copper has a lower electric resistance and specific electric resistance than aluminum. However, Copper has a higher thermal conductive coefficient than aluminum. Since copper has relatively high electro migration (EM) and superior stress migration (SM) compared to aluminum, copper may be suitable for semiconductor devices having shallow line widths.

However, when copper is used in interconnections of semiconductor devices, copper may diffuse into an interlayer dielectric layer. Accordingly, copper interconnections may degrade electric characteristics and insulating characteristics of semiconductor devices.

Example FIGS. 1 and 2 are sectional views illustrating formation of an interconnection layer in a semiconductor device. As illustrated in FIGS. 1 and 2, metal layer 2 (e.g. which may serve as a barrier layer to prevent copper diffusion) may be formed over wafer 1, which may have a circuit section. Metal layer 2 may serve as a lower circuit interconnection.

Examples of materials that may be included in metal layer 2 include tungsten (W), tungsten alloys, titanium (Ti), titanium alloys, titanium nitride, tantalum (Ta), tantalum nitride, tantalum silicon nitrides, and other similar materials. Metal layer 2 may be deposited over wafer 1 by chemical vapor deposition (CVD), sputtering, or a similar process.

A copper layer (e.g. which may be a source of the copper interconnection) may be formed by an electroplating process. To form copper interconnections using electroplating, seed layer 3 may be formed over the surface of metal layer 2 (e.g. using a sputtering process). Seed layer 3 may have a thickness of about 50 Å. Pattern layer 4 may have an opening formed over the surface of seed layer 3. Electroplating may be performed on seed layer 3 (e.g. through the exposed opening of pattern layer 4) to form copper interconnection layer 5.

As illustrated in FIG. 2, pattern layer 4 may be removed after copper interconnection layer 5 has been formed. Seed layer 3 may serve as an electrode, resulting in a copper interconnection. Seed layer 3 may be formed over metal layer 2 before electroplating of seed layer 3. However, if electroplating is performed when there are irregularities in seed layer 3 and/or if seed layer 3 is not present, an underlying wafer may be damaged.

SUMMARY OF THE INVENTION

Embodiments relate to a device which detects a copper seed layer before an electroplating process on the copper seed layer. Embodiments relate to detecting a seed layer with a device. Embodiments relate to a device which forms layers on a semiconductor device using a seed layer detecting device. Embodiments relate to forming layers on a semiconductor device using a device.

In embodiments, a device detects a seed layer formed on a wafer. The device may include at least one of an annular frame (e.g. installed over the wafer with a shape which corresponds to the edge of the wafer), a sensor frame (e.g. installed in the annular frame), and a detecting unit (e.g. installed in the sensor frame, which may detect the seed layer).

In embodiments, a method detects a seed layer formed over a wafer. The method may include at least one of installing an annular frame (e.g. having a shape which corresponds to an edge of the wafer) above the wafer, moving a sensor frame (e.g. installed in the annular frame) into an inspection position for the wafer, detecting the seed layer (e.g. by using a detecting unit installed in the sensor frame), generating a detection signal (e.g. using the detecting unit), and determining if the seed layer formed over the wafer has defects (e.g. based on the detection signal).

In embodiments, a device forms layers on a semiconductor device. The device may include at least one of a metal layer forming unit (e.g. which forms a metal layer on a wafer), a copper seed layer forming unit (e.g. which forms a copper seed layer on the metal layer), a wafer alignment device (e.g. including a wafer alignment unit which aligns the wafer in a predetermined position), a copper seed layer detecting unit (e.g. positioned above the wafer alignment unit to detect the copper seed layer formed on the wafer), and a plating unit (e.g. which forms a copper interconnection layer on the copper seed layer).

In embodiments, a method forms layers on a semiconductor device. The method may include at least one of forming a copper seed layer on a wafer, aligning a flat zone of the wafer to a predetermined position, generating a detection signal (e.g. by detecting the copper seed layer formed on a top surface of the wafer), determining if the copper seed layer is formed on the wafer (e.g. based on the detection signal), and forming a copper interconnection layer on the copper seed layer (e.g. if the copper seed layer is formed on the wafer).

BRIEF DESCRIPTION OF THE DRAWINGS

Example

Example

Example

Example

DETAILED DESCRIPTION

Figure 1:
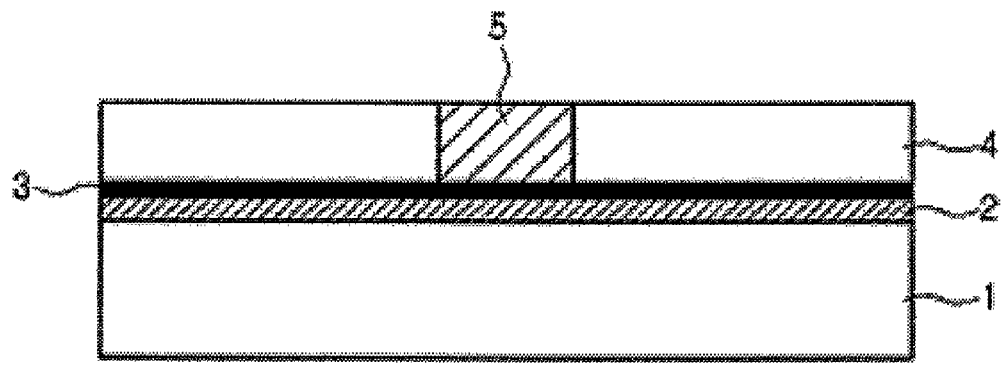
FIGS. 1 and 2 are sectional views illustrating the formation of an interconnection layer of a semiconductor device, in accordance with embodiments.
Figure 2:
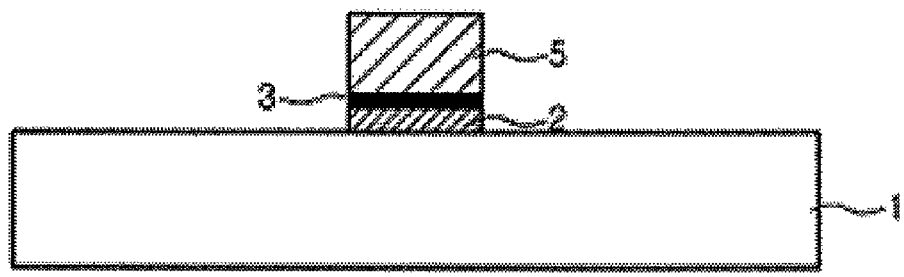
Figure 3:
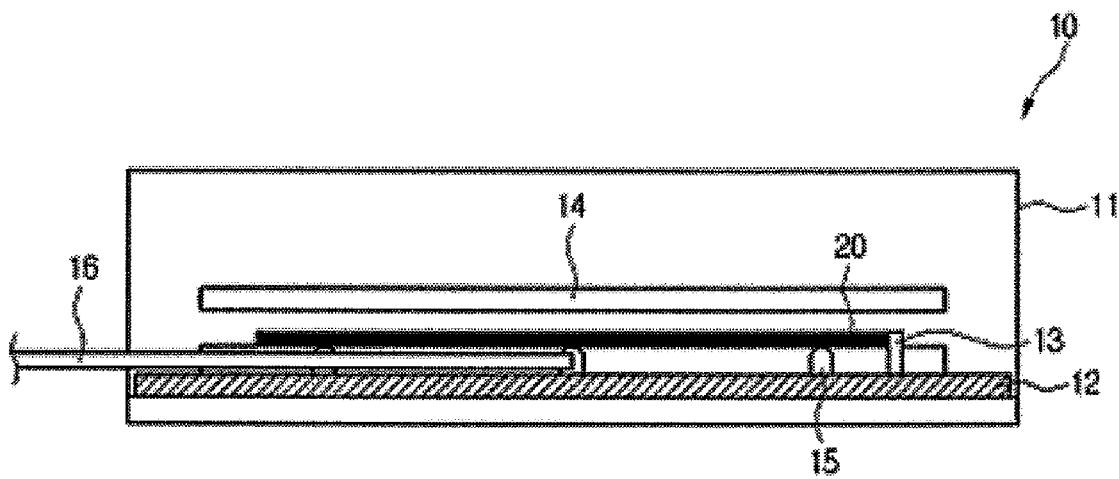
FIG. 3 is a longitudinal sectional view illustrating the structure of an aligner of a device which forms layers on a semiconductor device, in accordance with embodiments.
Figure 4:
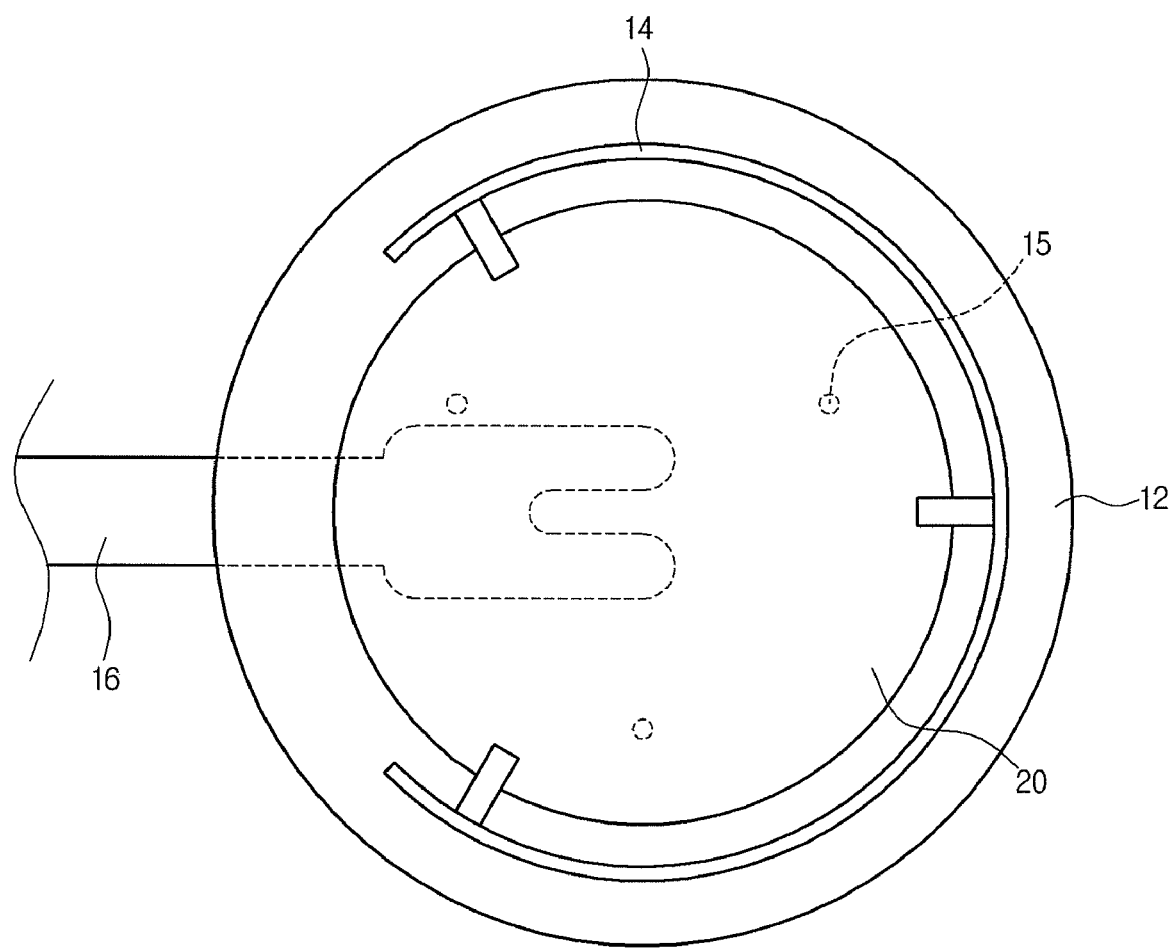
FIG. 4 is a plan view illustrating an aligner of a device which forms layers on a semiconductor device, in accordance with embodiments.

Embodiments relate to a device which forms layers on a semiconductor device. A device may include process modules, each of which may perform different functions.

In embodiments, a device which forms layers on a semiconductor device may include at least one of a metal deposition chamber (e.g. which deposits a metal layer on a wafer), a seed layer deposition chamber (e.g. which deposits a seed layer on the metal layer), an aligner (e.g. which aligns the wafer), and a transfer chamber (e.g. having a robot arm for loading/unloading the wafer into/from each chamber).

A wafer may be placed in a metal deposition chamber. A reaction gas may be injected into the metal deposition chamber to deposit a metal layer over the top surface of the wafer. In embodiments, a metal layer may include titanium deposited over the top surface of a wafer (e.g. having a thickness of about 100 Å). A seed layer (e.g. having a thickness of about 200 Å) may be deposited in the seed layer deposition chamber using a sputtering process. In embodiments, after the metal layer and the seed layer have been sequentially formed on the wafer, the wafer may be transferred to a plating chamber (e.g. where copper may be plated onto the seed layer).

As illustrated in FIGS. 3 to 5a, aligner 10 may precisely align a flat zone and the center of a wafer to a predetermined position. Aligner 10 may include chamber 11, wafer transfer arm 16, base plate 12, pins 15, poles 13, and/or seed layer detecting device 14. Chamber 11 of aligner 10 may include a space which aligns wafer 10 to a predetermined position. Wafer transfer arm 16 may load/unload wafer 20 into/from chamber 11. Base plate 12 may be located at the bottom of chamber 11 to support wafer 20. Pins 15 may form a space between base plate 12 and wafer 20. The upper portions of pins 15 may have hemispherical shapes. Poles 13 may be located on base plate 12 to align the position of wafer 20. For example, poles 13 may align the flat zone of wafer 20.

Seed layer detecting device 14 may be located above wafer 20 to detect a seed layer formed over the top surface of wafer 20. For example, seed layer detecting device 14 may include a detecting unit which detects a seed layer on the wafer. A detection signal may be generated from a detecting unit (e.g. which may be controlled by a central processing unit). Seed layer detecting device 14 may be located above wafer 20 and may detect a seed layer formed on the top surface of wafer 20.

In embodiments, seed layer detecting device 14 may include coupling member 145. Coupling member 145 may include a coupling slot 145a, which may be coupled with base plate 12 of aligner 10. Seed layer detecting device 14 may include support bar 141 connected to coupling member 145. Seed layer detecting device 14 may include frame 142 connected to support bar 141. Support bar 141 may be located at an inner portion of frame 142 at guide rail 142a. Seed layer detecting device 14 may include sensor frame 143, which may be coupled to guide rail 142a. Imaging device 144 may be installed on sensor frame 143.

Base plate 12 of aligner 10 may be spaced apart from frame 142 by support bar 141. Through the space created by support bar 141, wafer transfer arm 16 can load or unload wafer 20 to be placed on base plate 12 without colliding with frame 142. Coupling member 145 may have a hexahedral block shape. Coupling member 145 may be located at a lower end portion of support bar 141. Coupling member 145 may be located at an inner portion of support bar 141. Coupling slot 145a may be coupled with a lateral side of base plate 12. In embodiments, coupling member 145 may be coupled to support bar 141 by a screw (or similar fastener).

Figure 5A:
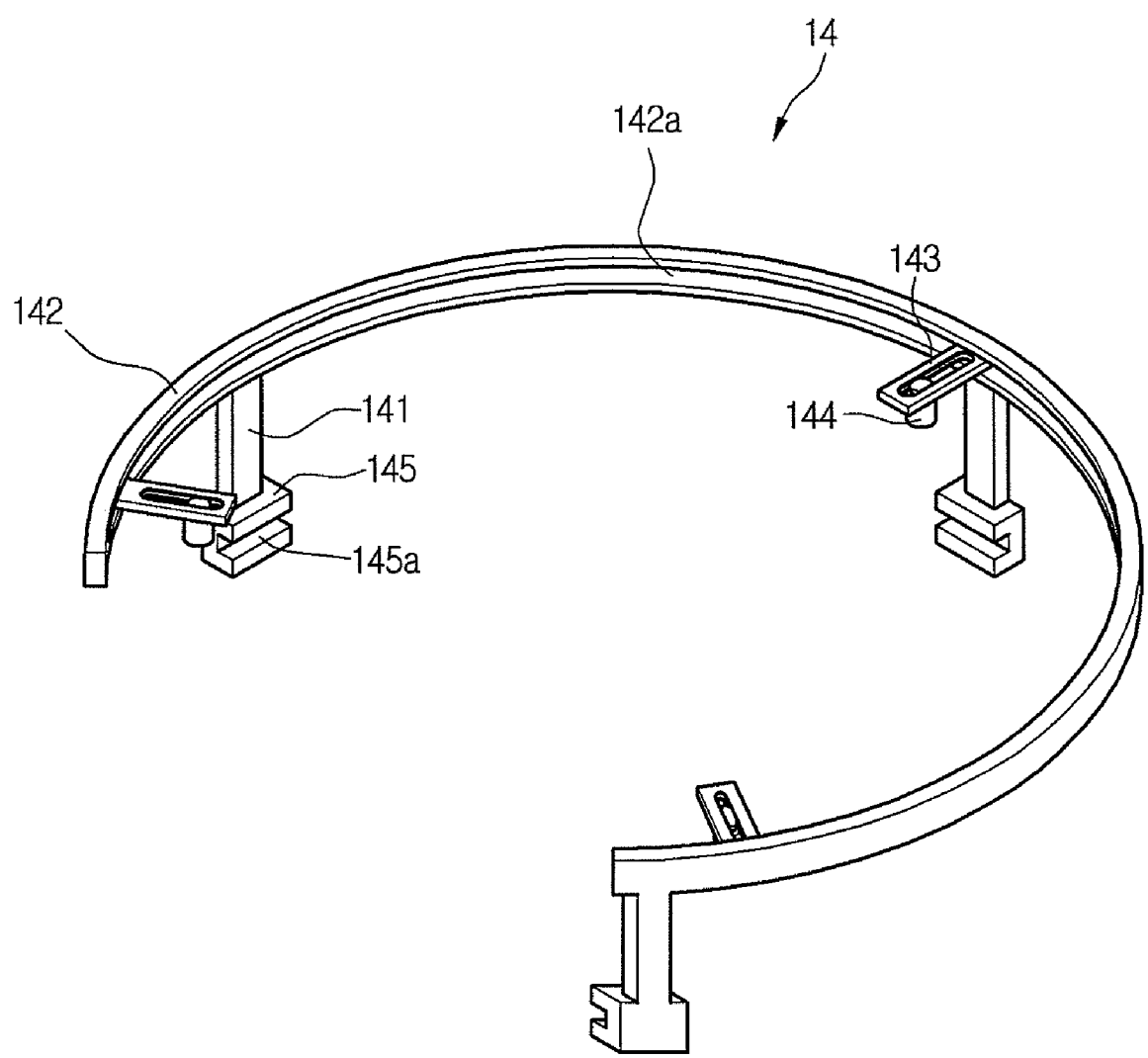
FIGS. 5a and 5b are enlarged perspective views schematically illustrating an imaging device installed in an aligner, in accordance with embodiments.
Figure 5B:
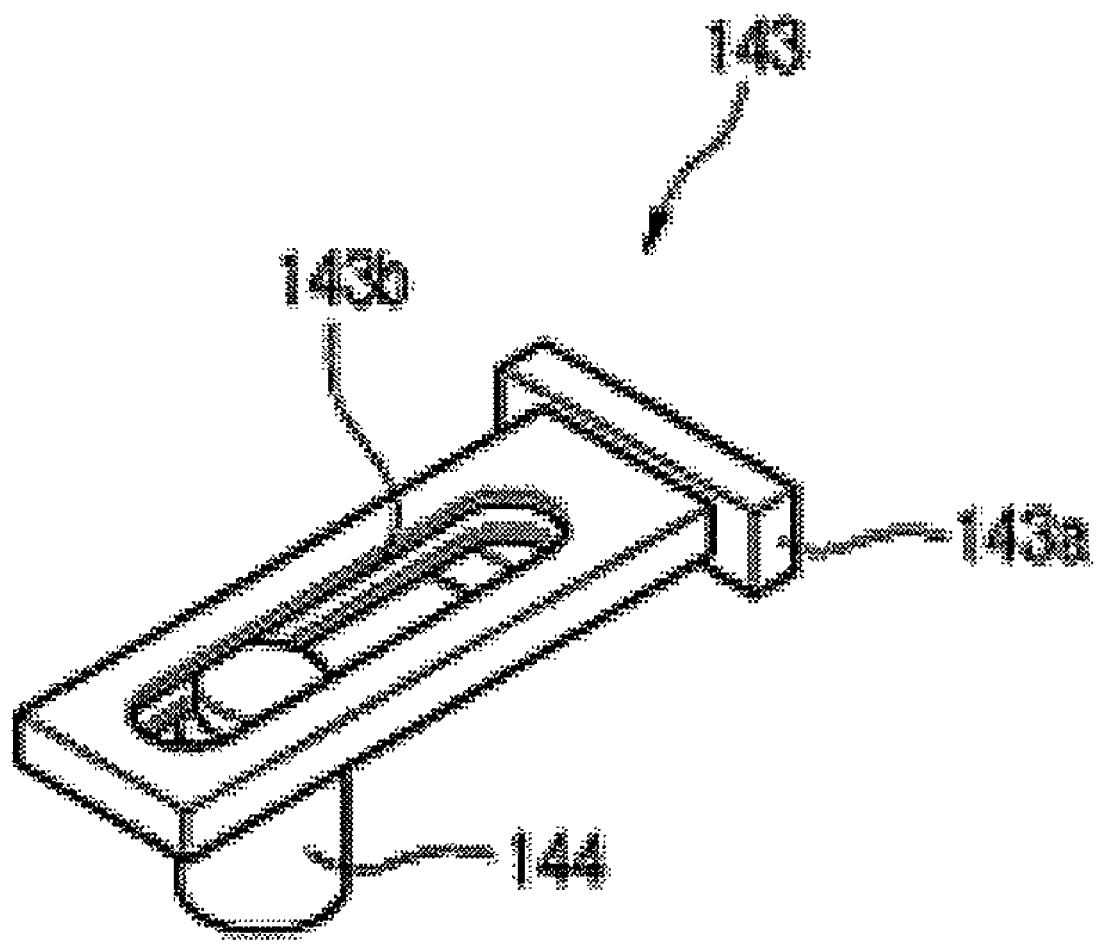

As illustrated in FIG. 5a, guide rail 142a is located at the inner portion of frame 142. In embodiments, guide rail 142a has a groove-shaped section. Sensor frame 143 may be attached to guide rail 142a, may have a hexahedral plate shape, and may have an opening. As illustrated in FIG. 5b, locking protrusion 143a may be located at the end of sensor frame 143. Locking protrusion 143a may be coupled to guide rail 142a, such that sensor frame 143 can move along guide rail 142a.

Sensor frame 143 may include an opening in a central area having slot 143b. Imaging device 144 may be inserted into slot 143b. Imaging device 144 may move along slot 143b of sensor frame 143 while crossing wafer 20. Sensor frame 143 may move along guide rail 142a of frame 142 and imaging device 144 may move along slot 143b of sensor frame 143 while crossing the wafer 20. In embodiments, a seed layer formed on the top surface of wafer 20 may be precisely detected by sensor frame 143.

The number of imaging devices (e.g. imaging device 144) may vary depending on the required inspection precision for a wafer. A plurality of sensor frames (e.g. sensor frame 143) may be coupled to frame 142. In embodiments, imaging device 144 may include a light emitting diode and a light receiving diode. In embodiments, imaging device 144 may include a light irradiation unit to photograph wafer 20.

Embodiments relate to a method of detecting a seed layer formed on the top surface of a wafer using a seed layer detecting device. A seed layer detecting device may be included in a device which forms layers on the semiconductor device.

In embodiments, a metal layer is deposited on the top surface of a wafer through a metal layer deposition process. During the metal layer deposition process, heat (e.g. with a temperature higher than room temperature) may be applied to a wafer. If the top surface of a wafer (e.g. including a seed layer) is contaminated by particles (or similar objects), voids may be created in a semiconductor device after a plating process. To prevent voids, wafer 20 may be transferred into vacuum chamber 11 of aligner 10 by transfer arm 16. Wafer 20 may be loaded on pins 15 (e.g. 3-4 pins) and aligned in a predetermined direction based on the center and align marks of wafer 20.

After wafer 20 has been aligned, the flat zone of wafer 20 may make contact with poles 13 such that centering and flat zone alignment of wafer 20 may be precisely achieved. Imaging device 144 (e.g. which may be located on sensor frame 143 surrounding wafer 20) may detect a seed layer formed on the top surface of wafer 20.

Imaging device 144 (e.g. which may be located on sensor frame 143) may move in a circumferential direction of wafer 20 along guide rail 142a of frame 142. Imaging device may move along slot 143b of sensor frame 143 while crossing wafer 20. The position of imaging device 144 may be changed based on the size of wafer 20.

In embodiments, imaging device 144 may include a light emitting diode and a light receiving diode. Light irradiated onto the surface of wafer 20 from a light emitting diode may be reflected by a seed layer formed on wafer 20, so that light is reflected back to imaging device 144 and into a light receiving diode. A central processing unit may determine if a seed layer is formed on the top surface of wafer 20 based on the light response received at a light receiving diode.

If there are areas on the top surface of wafer 20 that do not include a seed layer, light irradiated from a light emitting diode onto those areas of wafer 20 will be substantially totally reflected. If a seed layer is formed on the entire top surface of wafer 20, light irradiated onto wafer 20 from light emitting diode will be partially reflected (i.e. have a scattered reflection).

When light reflected from wafer 20 is reflected into a light receiving diode, light receiving diode may generate a current having a predetermined intensity. Generated current may be input into a central processing unit. A central processing unit may store a signal (e.g. which may be amplified by a signal amplifier) and may compare the value of the signal with predetermined signal value to determining if a seed layer is formed on the top surface of wafer 20.

In embodiments, imaging device 144 may include a camera to inspect the surface of wafer 20. Light may be irradiated onto the surface of wafer 20 from a light irradiation unit. A camera may have a resolution of a micrometer. A camera may include an objective lens group and/or a CCD (charge coupled device) which converts an optical image into an electric signal. A light irradiation unit may include a light source (e.g. a halogen lamp in embodiments) and a condenser lens which focuses light.

A central processing unit may generate on/off signals by detecting a seed layer based on a signal input into light receiving diode. If it is determined that a seed layer formed on wafer 20 has a defect, wafer 20 may be transferred to an apparatus for forming a seed layer by a transfer arm.

In embodiments, a seed layer may be detected by inspecting the surface of a wafer resting on an aligner using an imaging device included in the aligner. Accordingly, it may not be necessary to detect a seed layer outside of an aligner. In embodiments, a seed layer may be detected before a plating process.

A wafer with a seed layer may then be transferred to a plating chamber for implantation of a plating process. In embodiments, a plating layer may be formed on the entire surface of a seed layer of wafer 20. In embodiments, a plating layer may be selectively formed on wafer 20 by forming a photoresist pattern on wafer 20.

Current may be applied to a seed layer to charge the seed layer. A metal deposition solution may be fed onto a charged seed layer so that a metal layer (e.g. a copper metal layer) can be deposited on the seed layer. A seed layer primarily formed on wafer 20 may include a copper interconnection layer formed on the surface of wafer 20. Since a seed layer may easily react with copper particles, a copper interconnection layer having desirable characteristics may be achieved.

In embodiments, a seed layer may be detected before a plating process (e.g. which forms an interconnection layer), which may improve reliability. Embodiments may prevent a wafer having no seed layer from being loaded into a plating apparatus, which may improve the yield rate of wafers and/or may prevent a semiconductor manufacturing device from being damaged or broken. In embodiments, when a wafer is formed with a seed layer having defects, the wafer is prevented from being transferred to subsequent processing stages, which may improve reliability and/or allow workers to more effectively manage processes. In embodiments, since a wafer may be inspected using an imaging sensor located in a sensor frame (e.g. which may be easily mounted on an alignment apparatus), inspection time may be shortened for a more efficient semiconductor manufacturing process.

It will be apparent to those skilled in the art that various modifications and variations can be made to embodiments. Thus, it is intended that embodiments cover modifications and variations thereof within the scope of the appended claims.

What is claimed is:

1. An apparatus comprising:
   a metal layer forming unit which forms a metal layer on a wafer;
   a copper seed layer forming unit which forms a copper seed layer on the metal layer;
   a wafer alignment device;
   a wafer alignment unit comprised in the wafer alignment device, wherein the wafer alignment unit aligns the wafer to a predetermined position;
   a copper seed layer detection unit comprised in the wafer alignment device, wherein the copper seed layer detection unit is above the wafer alignment to detect the copper seed layer formed on the wafer;
   a plating unit which forms a copper interconnection layer on the copper seed layer; and
   a detection unit comprising at least one imaging device which photographs the wafer.

2. The apparatus of claim 1, wherein the wafer alignment unit comprises:
   a support plate which supports the wafer;
   a plurality of pins which spaces the wafer apart from the support plate; and
   alignment poles for aligning a flat zone of the wafer to a predetermined position.

3. The apparatus of claim 1, wherein the copper seed layer detection unit comprises:
   an annular frame above the wafer having a shape corresponding to an edge of the wafer;
   a sensor frame coupled to the annular frame; and
   a detection unit is coupled to the sensor frame to detect the copper seed layer.

4. The apparatus of claim 3, wherein the annular frame comprises a guide rail at an inner portion of the annular frame, wherein the sensor frame moves along the guide rail.

5. The apparatus of claim 3, wherein the annular frame has an elongated opening extending along the wafer and the detection unit is installed in the elongated opening.

6. The apparatus of claim 3, wherein the detection unit includes a light emitting diode irradiating light onto the wafer and a light receiving diode detecting the light reflected from the wafer.

7. A method comprising:
   forming a copper seed layer on a wafer;
   aligning a flat zone of a wafer to a predetermined position;
   detecting formation of the copper seed layer on a top surface of the wafer;
   generating a detection signal in response to detection of the formation of the copper seed layer;
   determining if the copper seed layer is formed on the wafer based on the detection signal; and
   forming a copper interconnection layer on the copper seed layer if the copper seed layer is formed on the wafer.

8. The method of claim 7, wherein the copper interconnection layer is formed by an electroplating process.

* * * * *